United States Patent [19]
Jang

[11] Patent Number: 5,886,937
[45] Date of Patent: Mar. 23, 1999

[54] SEMICONDUCTOR READ ONLY MEMORY AND A METHOD FOR READING DATA STORED IN THE SAME

[75] Inventor: Cheol-Ung Jang, Kyunggi-do, Rep. of Korea

[73] Assignee: Samsung Electronics, Co., Ltd., Suwon, Rep. of Korea

[21] Appl. No.: 1,936

[22] Filed: Dec. 31, 1997

[30] Foreign Application Priority Data

Dec. 31, 1996 [KR] Rep. of Korea .................. 1996 80805

[51] Int. Cl.$^6$ ....................................................... G11C 7/00
[52] U.S. Cl. ..................................... 365/203; 365/185.25
[58] Field of Search ..................................... 365/203, 204, 365/185.11, 185.13, 185.25, 230.03

[56] References Cited

U.S. PATENT DOCUMENTS

| | | | |
|---|---|---|---|
| 5,414,663 | 5/1995 | Komarek et al. | 365/203 |
| 5,416,743 | 5/1995 | Allan et al. | 365/203 |
| 5,450,361 | 9/1995 | Iwahashi et al. | 365/200 |
| 5,467,300 | 11/1995 | Komarek et al. | 365/203 |
| 5,757,709 | 5/1998 | Suminaga et al. | 365/203 |

*Primary Examiner*—Son T. Dinh
*Attorney, Agent, or Firm*—Marger Johnson & McCollom, P.C.

[57] ABSTRACT

Disclosed is a NOR type mask ROM device with a hierarchical bit line architecture in which metal oxide semiconductor FETs constituting memory cells are connected in parallel to one another. The mask ROM device is implemented with an address transition detection (ATD) circuit, and comprises first and second bit lines arranged in the ratio of 2:1, ground lines corresponding to the second bit lines, respectively, first switches each connected between an end of a corresponding odd-numbered bit line of the first bit lines and an end of a corresponding bit line of the second bit lines, second switches each connected between an end of a corresponding even-numbered bit line of the second bit lines and an end of a corresponding ground line of the ground lines, and a charging circuit for charging at least one adjacent non-selected bit line of the first bit lines at both sides of at least one selected bit line of the first bit lines to a predetermined voltage level, when a precharging operation is carried out to sense data through at least one selected bit line of the second bit lines.

5 Claims, 7 Drawing Sheets

SEMICONDUCTOR READ ONLY MEMORY AND A METHOD FOR READING DATA STORED IN THE SAME

FIELD OF THE INVENTION

The present invention relates to a semiconductor read only memory (ROM) device, and more particularly to a NOR type mask ROM with a hierarchical bit line architecture in which metal oxide semiconductor FETs (MOSFETs) constituting memory cells are connected in parallel to one another and which an address transition detection (ATD) is implemented, and a method for reading data stored in the same.

BACKGROUND OF THE INVENTION

FIG. 1 illustrates a typical ROM device in which ATD technology is implemented. As shown in this figure, input buffers 12, 14, 16 and 18 receive a chip enable signal, row address signals, column address signals and an output enable signal which are applied externally, and output internal signals such as a chip enable signal CEPi, a row address signal RAPi, a column address signal CAPi and an output enable signal OEi. These signals RAPi and CAPi from the row and column address buffers 14 and 16 are applied to the row predecoder 26 and column predecoder 28, respectively. The predecoders 26 and 28 are provided to select specific memory cells of the cell array 10 in response to the signals RAPi and CAPi. The signals CEPi, RAPi and CAPi from the buffers 12, 14 and 16 are applied to the short pulse generation circuits 34,36 and 38 of the ATM circuit 30. The short pulse generation circuit 34 generates a short pulse signal every time transition of the chip enable signal CEPi occurs. Each of the other circuits 36 and 38 also generates a short pulse signal every time transition of at least one input address occurs. All of the short pulse signals generated thus are applied to the summator 40, which generates a pulse signal SMO having a preset width by adding widths of the applied short pulse signals. The read control circuit 42 generates a precharge control signal PRE and a sense amp control signal SACS in response to the pulse signal SMO provided from the summator 40. Then, the precharging operation of the bit lines is carried out while the precharge control signal PRE is maintained at a predetermined voltage level.

Sense amplifier circuit 22 amplifies data signals which are stored in memory cells selected by the predecoders 26 and 28, and provides them to the data latch circuit 24. Output signals of the data latch circuit 24 are provided to external circuits (not shown) via the data output buffer 32 in response to the output enable signal OEi.

As shown in FIG. 2 which shows a prior art NOR type mask ROM with hierarchical bit line architecture, each cell array block of the mask ROM is formed in a such manner that bit lines are arranged in hierarchical form. As an example, bit lines are constituted with extended main bit lines MBL1, MBL2, . . . , and sub-bit lines SBL1, SBL2, . . . along corresponding columns defined on a substrate. Each main bit line is a metal bit line which is composed of aluminum, and each sum-bit line is a diffusion bit line which is composed of a diffusion layer. Two sub-bit lines are arranged corresponding to one main bit line. In each cell array block, the sub-bit lines are classified into two groups. Of the two groups, one group is formed by odd-numbered sub-bit lines SBL1, SBL3, . . . , etc. and the other group is formed by even-numbered sub-bit lines SBL2, SBL4, . . . etc. Two even-numbered sub-bit lines correspond to one ground line GL. Two odd-numbered and two even-numbered sub-bit lines are interdigitated to one another.

In each cell array block of FIG. 2, the memory cells Mmn (where m=1, 2, . . . , I; and n=1, 2, . . . , j) composed of MOSFETs are connected in parallel with a plurality of sub-bit lines SBL1, SBL2, . . . , etc. which are intersected with word lines WL1~WLi. As an example, each memory cell Mmn is arranged in each cell region which is defined by intersecting each pair of sub-bit lines SBL1 and SBL2, SBL3 and SBL4, . . . etc. extending in column direction with the word lines WL1~WLi extending in row direction. Gates of the memory cells which are arranged in the row direction are connected to corresponding word lines. As well-known in this art, each memory cell composed of MOSFETs is programmed to either an on-cell state or an off-cell state. Herein, the on-cell state means that the memory cell is at a low threshold voltage (e.g., 0.5 V), and the off-cell state means that the memory cell is at a high threshold voltage (e.g., 5 V).

Memory cells M1k, M2k, . . . , Mik (where k is an integer which is 1 or more) in respective columns between two adjacent sub-bit lines SBL1 and SBL2, SBL2 and SBL3, SBL3 and SBL4, . . . , etc. constitute a single string or a bank. Between two adjacent odd-numbered sub-bit lines SBL2k−1 and SBL2k+1, for example, SBL1 and SBL3, SBL3 and SBL5, . . . , etc. and between two adjacent even-numbered sub-bit lines SBL2k and SBL2k+2, for example, SBL2 and SBL4, SBL4 and SBL6, . . . , etc. two cell strings are assigned. Sources of memory cells in two adjacent strings are commonly connected to corresponding even-numbered sub-bit lines SBL2k, and drains thereof are connected to two odd-numbered sub-bit lines SBL2k−1 and SBL2k+1 at both sides of each strings, respectively. For example, the sources of the cells M13 and M14 are commonly connected to the sub-bit line SBL4, and the drains thereof are connected to the sub-bit lines SBL3 and SBL5, respectively. Odd-numbered sub-bit lines SBL1, SBL3, . . . , etc. are electrically connected to the main bit lines MBL1, MBL2, . . . , etc. via a first string selection circuit which is constituted with string selecting nMOSFETs ST1, ST2, . . . , etc., respectively. Similarly, even-numbered sub-bit lines SBL2, SBL4, . . . , etc. are electrically connected to the ground lines GL1, GL2, . . . , etc. via a second string selection circuit which is constituted with ground selecting MOSFETs GT1, GT2, . . . , etc., respectively. The main bit lines MBL1, MBL2, . . . , etc. are electrically connected to the sense amplifiers SA1, SA2, . . . , etc. via a group of first column selecting MOSFETs GBT1, GBT2, . . . , etc., respectively, and the ground lines GL1, GL2, . . . , etc. are connected to the ground Vss via a group of second column selecting MOSFETs GBT1, GBT, . . . , etc.

The typical ROM device of FIG. 1 can be reduced in parasitic capacitance of the bit lines, as compared with the prior art NOR type ROM device of FIG. 2. Particularly, when the bit lines are composed of diffusion layers, a wiring resistance thereof is considerably reduced.

However, during the bit line precharge operation for reading data stored in memory cells, the bit line precharge state may be greatly varied in accordance with programing states of both the memory cell to be selected and the adjacent memory cell thereof. As an example, in case memory cells adjacent to the memory cell to be selected are programmed as off-cells, the main bit line related to the selected memory cell is normally precharged, so that the cell reading operation can be normally carried out. If all the memory cells M11~M14 of FIG. 2 are programmed as on-cells and the memory cell M15 as off-cell, after the main bit line MBL2 starts to be precharged, the precharge level of the main bit line MBL1 is not maintained to a specific level and is dropt down, by allowing the word line WL1 to be activated and the string selecting MOSFET ST3 to be turned on, between the selection of the memory cell 15 and the data sensing thereof. This is because, when the word line WL1 is activated, all the memory cells M11~M14 are turned on and thereby leakage current flows to the sub-bit lines SBL4, SBL3, SBL2 and SBL1, passing through the main bit line MBL2, the sub-bit line SBL5, the cells M14, M13, M12 and M11 sequentially. As a result, the sub-bit lines SBL4, SBL3, SBL2 and SBL1 are functioned as loads of the selected main bit line MBL2. Precharge level drop of the main bit line leads to reduction in data sensing margin, and acts as a factor of limiting high-speed read operation of mask ROM devices. Also, the mask ROM devices having the above described construction is not possible to operate with a low power supply Vcc.

SUMMARY OF THE INVENTION

It is, therefore, an object of the invention to provide a NOR type ROM device which can operate with a low power supply and at high speed operation.

It is another object of the present invention to provide a NOR type ROM device in which a bit line precharge operation can be stably carried out.

It is a further object of the present invention to provide a method for reading data stored in memory cells of a NOR type ROM.

According to an aspect of the present invention, a semiconductor read only memory having an hierarchical bit line architecture comprises a plurality of first bit lines; a plurality of memory cell groups each connected between two adjacent bit lines of the first bit lines; a plurality of second bit lines, the first and second bit lines being in the ratio of 2:1; a plurality of ground lines corresponding to the second bit lines, respectively; a plurality of first switches each connected between an end of a corresponding odd-numbered bit line of the first bit lines and an end of a corresponding bit line of the second bit lines; a plurality of second switches each connected between an end of a corresponding even-numbered bit line of the second bit lines and an end of a corresponding ground line of the ground lines; and means for charging at least one adjacent non-selected bit line of the first bit lines at both sides of at least one selected bit line of the first bit lines to a predetermined voltage level, when a precharging operation is carried out to sense data through at least one selected bit line of the second bit lines.

According to the other aspect of the present invention, a method for reading data stored in a semiconductor read only memory having an hierarchical bit line architecture comprises the steps of charging at least one adjacent non-selected bit line of the first bit lines at both sides of at least one selected bit line of the first bit lines to a predetermined voltage level, when at least one selected bit line of the second bit lines is precharged; and carrying out a data sensing operation through the at least one selected bit line of the second bit lines.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

Figure 3:
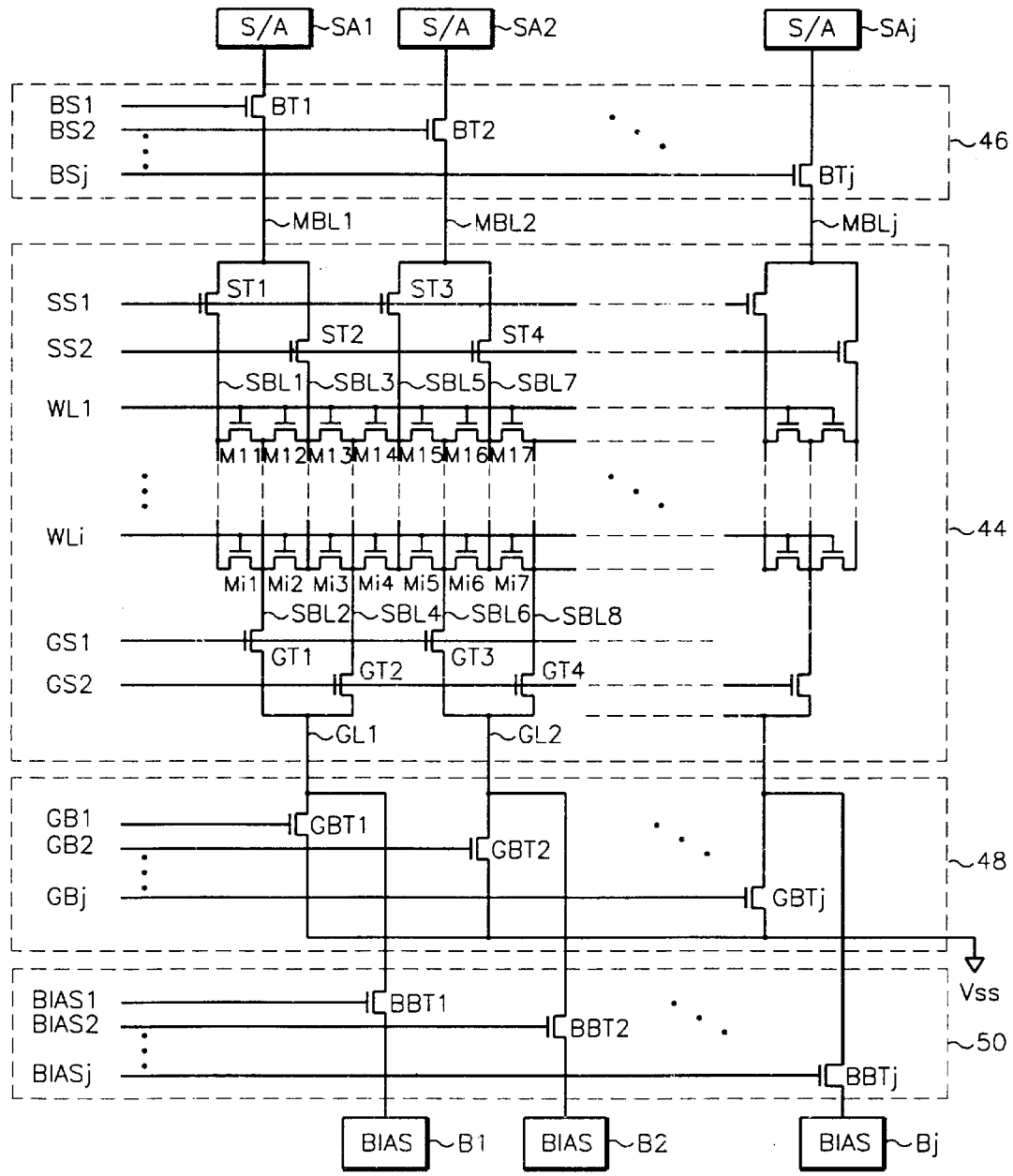
FIG. 3 is a circuit diagram showing core part of a mask ROM according to a first embodiment of the present invention.

FIG. 3 shows the memory cell array block and its peripheral circuits of the NOR type mask ROM with hierarchical bit line architecture according to a first embodiment of the present invention.

Referring to FIG. 3, the NOR type ROM has a cell array block 44, first and second column selection circuits 46 and 48, sense amplifier circuits SA1~SAj, bias voltage generation circuits B1~Bj and a bias selection circuit 50. Bit lines of the NOR type mask ROM are constituted with extended main bit lines MBL1, MBL2, . . . , and sub-bit lines SBL1, SBL2, . . . , etc. along corresponding columns defined on a substrate. Each of the sub-bit lines is formed by a diffusion layer. Two sub-bit lines are arranged corresponding to one main bit line. In each the cell array block 44, the sub-bit lines are classified into two groups. Of the two groups, one group is formed by odd-numbered sub-bit lines SBL1, SBL3, . . . , etc. and the other group is formed by even-numbered sub-bit lines SBL2, SBL4, . . . etc. Two odd-numbered and two even-numbered sub-bit lines are interdigitated to one another.

In addition, the memory cells Mmn (where m=1, 2, . . . , I; and n=1, 2, . . . , j) composed of MOSFETs are connected in parallel with two adjacent sub-bit lines, for example, SBL1 and SBL2, SBL2 and SBL3, . . . , etc. which are intersected with word lines WL1~WLi. In details, each memory cell Mmn is arranged in each cell region which is defined by intersecting each pair of sub-bit lines SBL1 and SBL2, SBL3 and SBL4, . . . etc. extending in column direction with the word lines WL1~WLi extending in row direction. Gates of the memory cells which are arranged in the row direction are connected to corresponding word lines.

Memory cells M1k, M2k, . . . , Mik (where k is an integer which is 1 or more) in respective columns between two adjacent sub-bit lines SBL1 and SBL2, SBL2 and SBL3, SBL3 and SBL4, . . . , etc. constitute one string or a bank. Between two adjacent odd-numbered sub-bit lines SBL2k−1 and SBL2k+1, for example, SBL1 and SBL3, SBL3 and SBL5, . . . , etc. and between two adjacent even-numbered sub-bit lines SBL2k and SBL2k+2, for example, SBL2 and SBL4, SBL4 and SBL6, . . . , etc. two cell strings are assigned. Sources of memory cells in two adjacent strings are commonly connected to corresponding even-numbered sub-bit lines SBL2k, and drains thereof are connected to two odd-numbered sub-bit lines SBL2k−1 and SBL2k+1 at both sides of each strings, respectively. For example, the sources of the cells M13 and M14 are commonly connected to the sub-bit line SBL4, and the drains thereof are connected to the sub-bit lines SBL3 and SBL5, respectively.

Odd-numbered sub-bit lines SBL1, SBL3, . . . , etc. are electrically connected to the main bit lines MBL1, MBL2, . . . , etc. via a first string selection circuit which is constituted with string selecting nMOSFETs ST1, ST2, . . . , etc., respectively. Similarly, even-numbered sub-bit lines SBL2, SBL4, . . . , etc. are electrically connected to the ground lines GL1, GL2, . . . , etc. via a second string selection circuit which is constituted with ground selecting MOSFETs GT1, GT2, . . . , etc., respectively.

The main bit lines MBL1~MBLj are electrically connected to the sense amplifiers SA1~SAj via the first column selection circuit 46 which is constituted with a group of first column selection MOSFETs BT1, BT2, . . . , etc., respectively.

Figure 4:
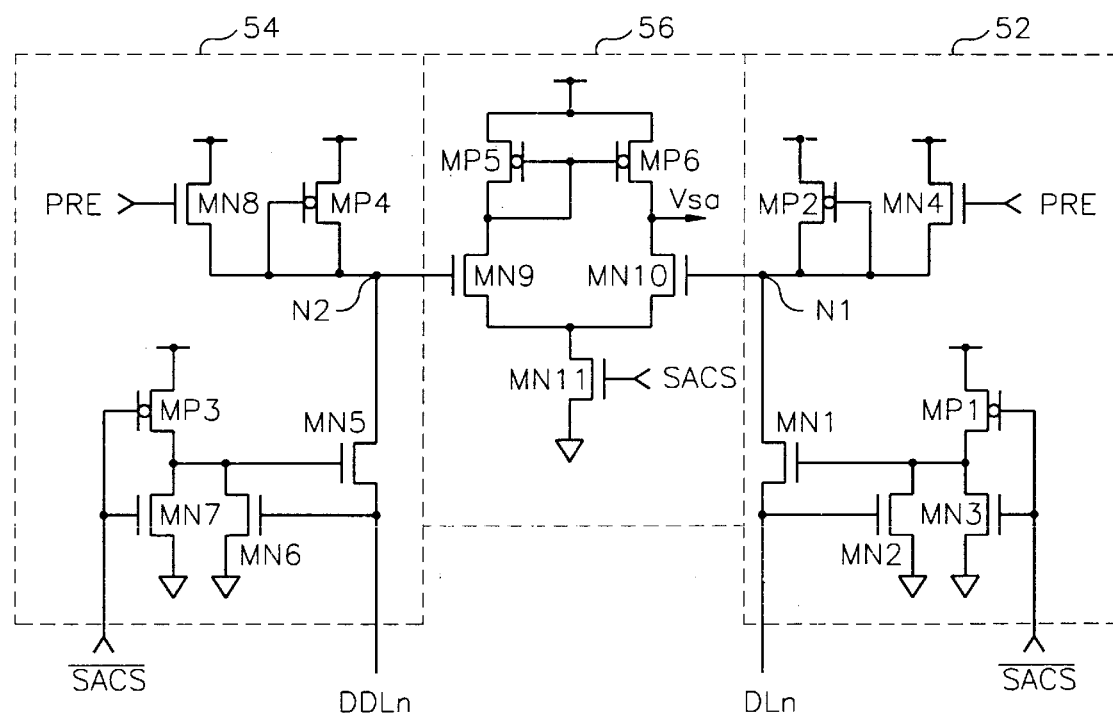
FIG. 4 is a circuit diagram of the sense amplifier shown in FIG. 3.

FIG. 4 shows an example of each sense amplifier circuit SAn shown in FIG. 3, where n is 1, 2, . . . , j. In this figure, the sense amplifier circuit SAn has a data line DL, a dummy data line or a reference line DDL, first and second precharge circuits 52 and 54, and a current mirror type differential amplifier 56. The data line DL is electrically connected to a corresponding main bit line MBLn via a corresponding MOSFET BTn of the first column selection circuit 46. The dummy data line DDL is provided to receive a reference voltage necessary for data sensing from a well-known dummy cell (not shown). The first precharge circuit 52 is provided to precharge a corresponding main bit line MBLn during a precharge time of the bit lines, and the second precharge circuit 54 to precharge a corresponding dummy bit line (not shown) during the precharge time.

Figure 1:
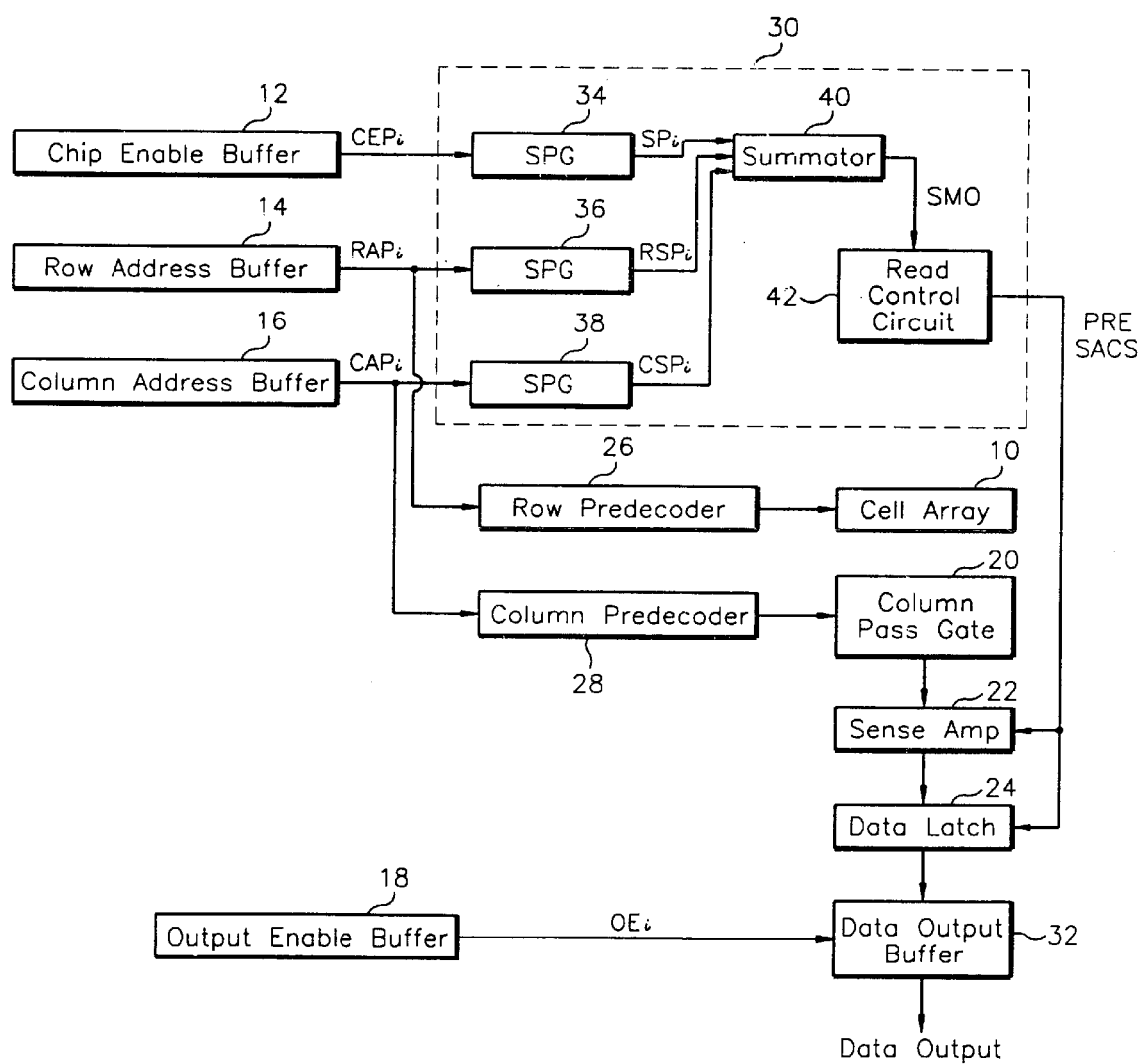
FIG. 1 is a block diagram of a typical semiconductor read only memory (ROM) to which address transition detection is implemented.
Figure 2:
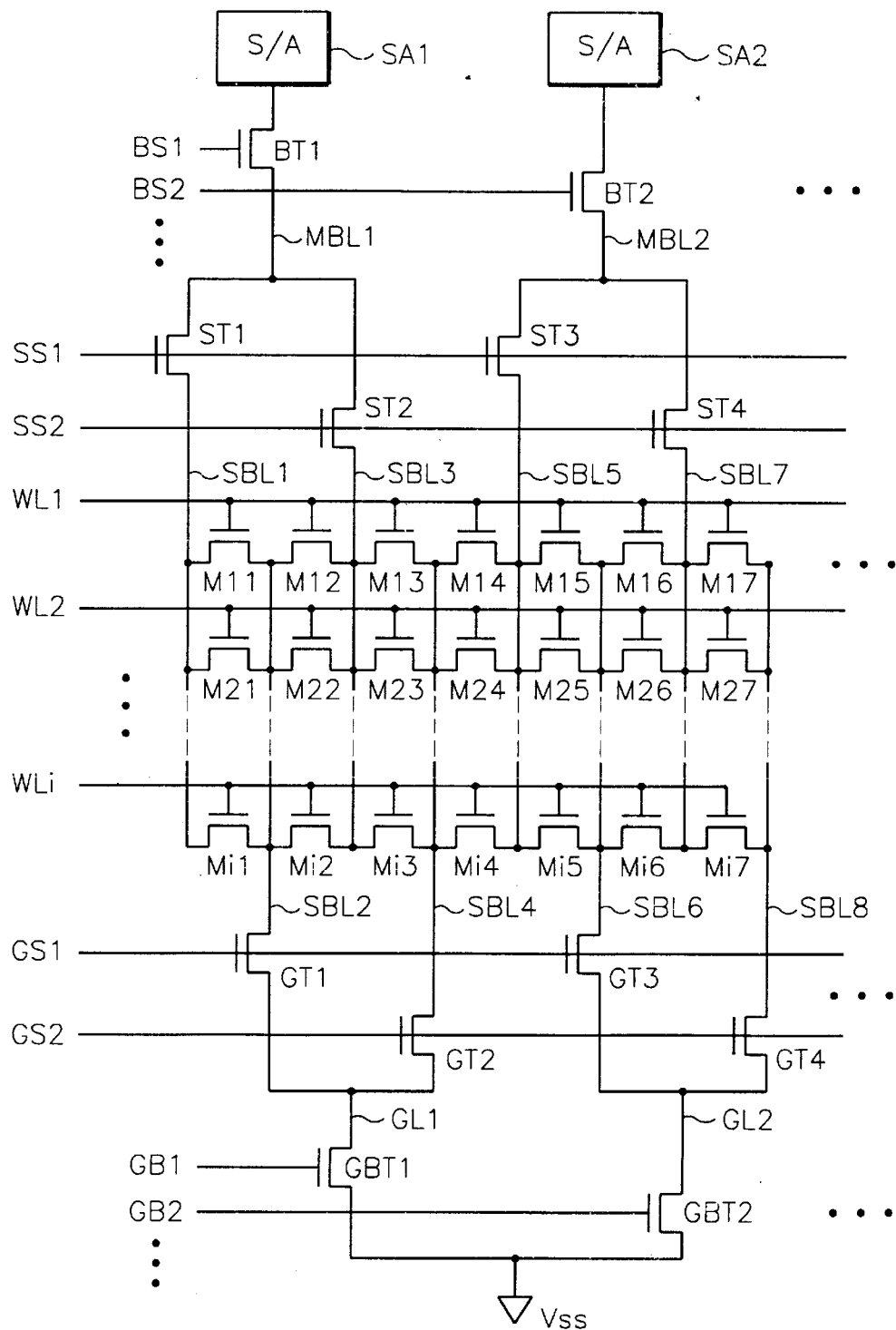
FIG. 2 is a circuit diagram showing core part of a prior art mask ROM with hierarchical bit line architecture.

Also, the first precharge circuit 52 is formed by four nMOSFETs MN1~MN4 and two pMOSFETs MP1 and MP2. Drain-source channel, i.e., current path of the nMOSFET MN1 is connected between one input node N1 of the differential amplifier 56 and the data line DL. Current path of the nMOSFET MN2 is connected between the gate of the nMOSFET MN1 and the ground, and a gate thereof is connected to a corresponding data line DLn. Current path of the nMOSFET MN3 is connected between the gate of the nMOSFET MN1 and the ground, and a gate thereof is connected to an input terminal which receives a complementary signal of the sense amp control signal SACS from the ATD (address transition detection) circuit 30 of FIG. 1. Current path of the pMOSFET MP1 is connected between a power supply and the gate of the nMOSFET MN1 and the ground, and a gate thereof is connected to an input terminal which receives the complementary signal. Current path of the nMOSFET MN4 is connected between the power supply and the input node N1 of the differential amplifier 56, and a gate thereof is connected to an input terminal which receives a precharge control signal PRE from the ATD (address transition detection) circuit 30 of FIG. 1. Current path of the pMOSFET MP2 is connected between the power supply and the input node N1, and a gate thereof is also connected to the input node N1. In this precharge circuit 52, the FETs MN4 and MP2 are functioned as a current source for delivering specific precharge current to a corresponding main bit line during the bit line precharge time, and the FETs MN1~MN3 and MP1 as a bias circuit for allowing the voltage levels of the corresponding main and sub-bit lines to become equal to a threshold voltage level of the nMOSFET MN2.

Similarly, the precharge circuit 54 has four nMOSFETs MN5~MN8 and two pMOSFETs MP3 and MP4, and has the same construction as the precharge circuit 52 except that a current path of the nMOSFET MN5 is connected between the other input node N2 of the differential amplifier 56 and a dummy data line DDLn, as shown in FIG. 4. In the precharge circuit 54, the FETs MN8 and MP4 are functioned as a current source for delivering specific precharge current to a corresponding main bit line during the bit line precharge time, and the FETs MN5~MN7 and MP3 as a bias circuit for allowing the voltage level of the corresponding dummy data line DDLn, i.e., a corresponding dummy bit line to become equal to a threshold voltage level of the nMOSFET MN6.

As shown in FIG. 4, the differential amplifier 56 is constituted by a pair of pMOSFETs MP5 and MP6 which are commonly connected to the power supply, nMOSFETs MN9 and MN10 which are respectively connected to the FETs MP5 and MP6, and an nMOSFET MN11 which is connected between the ground and a contact of the FETs MN9 and MN10. These FETs MN9 and MN10 have the same characteristics, gates thereof are connected to the reference line DDLn and data line DLN via the FETs MN5 and MN1 during a data sensing operation, respectively, and a gate of the FET MN11 is connected to the node which receives the sense amp control signal SACS.

Turning to FIG. 3, ground lines GL1~GLj may be electrically connected to a ground Vss via a second column selection circuit 48 which is constituted by a group of column selecting MOSFETs GBT1~GBTj, and also to the bias voltage generation circuits B1~Bj via the bias selection circuit 50 which is constituted by a group of column selecting MOSFETs BBT1~BBTj, respectively.

Figure 5:
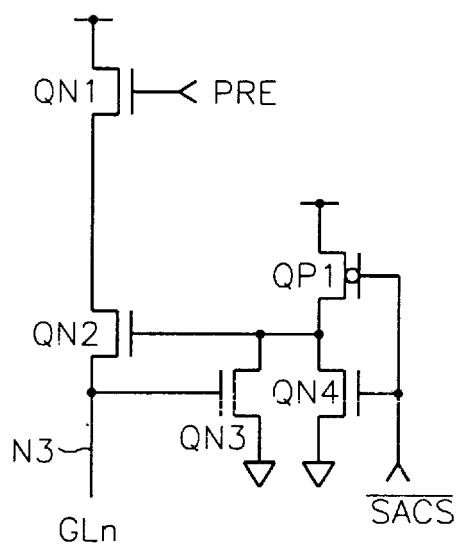
FIG. 5 is a circuit diagram of the bias circuit shown in FIG. 3.

FIG. 5 shows the respective bias voltage generation circuit Bn according to the present invention. In this figure, the bias voltage generation circuit has four nMOSFETs QN1~QN4 and one pMOSFET QP1. Between the power supply and a corresponding ground line GLn, current paths of the nMOSFETs QN1 and QN2 are connected in series. Current path of the nMOSFET QN3 is connected between the gate of the nMOSFET QN2 and the ground, and a gate thereof is connected to the node N3. This node N3 is connected to a corresponding ground line GLn via a corresponding FET BBTn of the bias selection circuit 50. Current path of the nMOSFET QN4 is connected between the gate of the nMOSFET QN2 and the ground, a gate thereof is connected to the node which receives the complementary signal of the sense amp control signal SACS. Current path of the pMOSFET QP1 is connected between the power supply and the gate of the nMOSFET QN2, and a gate thereof is connected to the node which receives the complementary signal In this embodiment having the above described construction, while a precharging operation is carried out to sense data through at least one selected main bit line of the main bit lines MBL1~MBLj, the second column selection circuit 46, the bias voltage generation circuits B1~Bj and the bias selection circuit 50 are provided to allow at least one very adjacent non-selected sub-bit line arranged at both sides of at least one selected sub-bit line of the sub-bit lines SBL1, SBL3, . . . , etc. to be charged to a predetermined precharge voltage. This charging operation will be described hereunder with reference to the timing diagram of FIG. 6.

When the memory cell M15 is programmed as an on-cell, i.e., in which data "1" is stored, or when the adjacent memory cells M14 and M15 at both sides of the memory cell M15 is programmed as an off-cell, i.e., in which data "0" is stored, the above described problems are generated during the bit line precharge time. Thus, the reading operation of the memory cell M15 is performed as follows.

Figure 6:
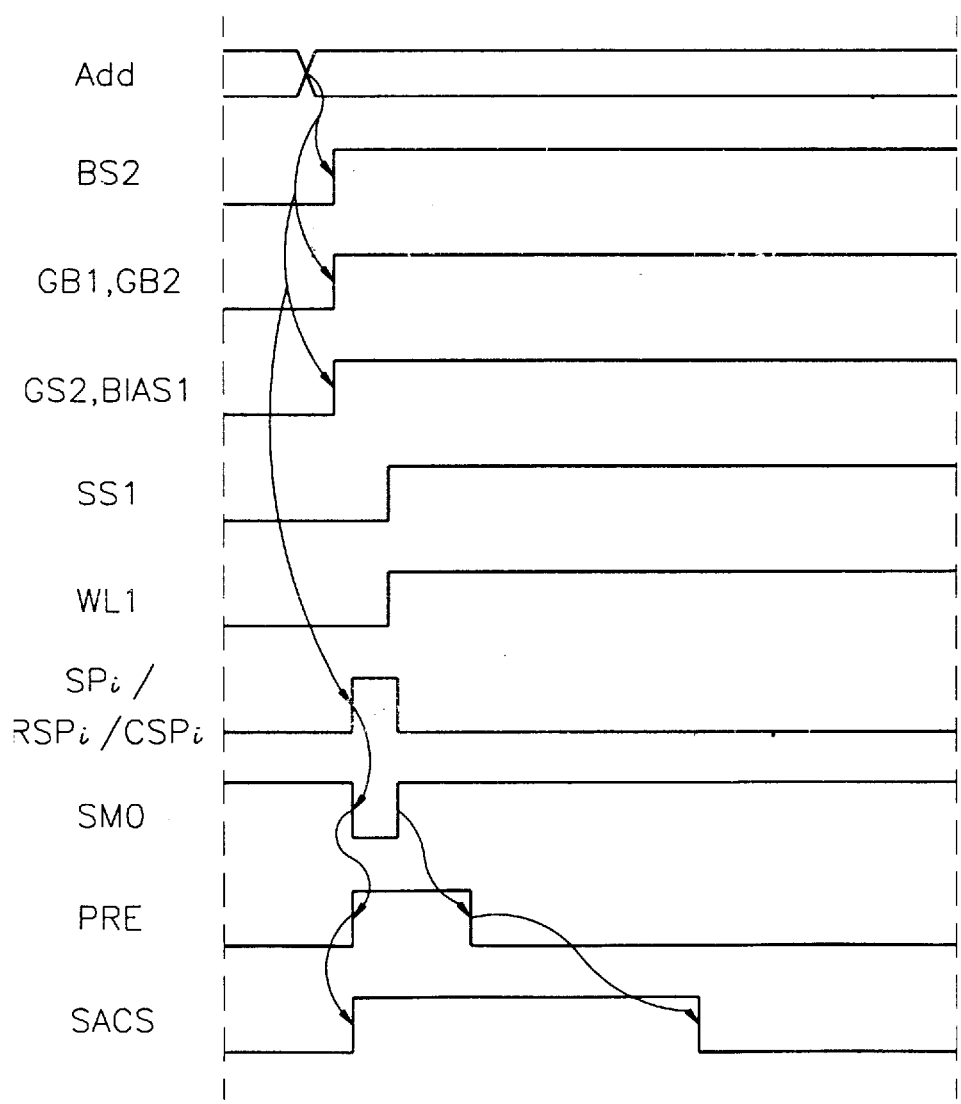
FIG. 6 is an operation timing diagram of the mask ROM shown in FIG. 3.

As shown in FIG. 6, if an address signal Add is externally applied to select the memory cell 15, a block selection signal BS2 is first activated by the column predecoder 28 (referring to FIG. 1), so that the main bit line MBL2 is electrically connected to the sense amplifier SA2. The block selection signal GB2 is then activated so that the ground line GL2 is electrically connected to the ground. Subsequently, the precharge circuits 52 and 54 of the sense amplifier SA2 allow the main bit line MBL2 and the reference line DDL2 corresponding thereto to be precharged to the predetermined voltage level in response to the precharge control signal PRE and sense amp control signal from the address transition detection circuit 30 (referring to FIG. 1). As a result, both of the word line WL1 and the string selection signal SS1 are activated, and then the data sensing operation starts. At this time, if the memory cell M15 is programmed as an on-cell, i.e., a cell having a low threshold voltage (e.g., 0.5 V), the amount of current flowing through the cell M15 becomes more than that of current flowing through dummy cell (not shown), and therefore the voltage level of the main bit line MBL2 is lowered less than that of the reference line. As a result, the differential amplifier 56 generates data of a high level (referred to as the "H") to serve as the on-cell.

On the contrary, if the memory cell M15 is programmed as an off-cell, i.e., a cell having a high threshold voltage (e.g., 5 V), the amount of current flowing through the cell M15 becomes less than that of current flowing through the dummy cell, and therefore the voltage level of the main bit line MBL2 is increased more than that of the reference line. As a result, the differential amplifier 56 generates data of a low level (referred to as the "L") to serve as the off-cell.

Assuming that all the memory cells M11, M12, M13 and M14 shown in FIG. 3 are programmed as on-cells and the memory cell M15 as off-cell. When an address signal Add is externally applied to select the memory cell M15, the block selection signals BS2 and GB2 are activated and at the same time the ground and bias selection signals GS2 and BIAS1 are activated. The bias voltage generation circuit B1 and the precharge circuits 52 and 54 allow the sub-bit line SBL4, the main bit line MBL2 and the reference line DDL2 to be precharged to the predetermined voltage level in response to the precharge control signal PRE and sense amp control signal from the address transition detection circuit 30 (referring to FIG. 1). As a result, although the word line WL1 is activated to turn all the memory cells M11~M14 on, the sub-bit line SBL4 is previously precharged and thereby the loading of the bit lines related to the memory cell M15 is reduced. As a result, the time required for precharging the bit lines is considerably shortened, so that data sensing speed can be improved. No leakage current is generated whereby the ROM can be operated with a low power supply Vcc.

Figure 7:
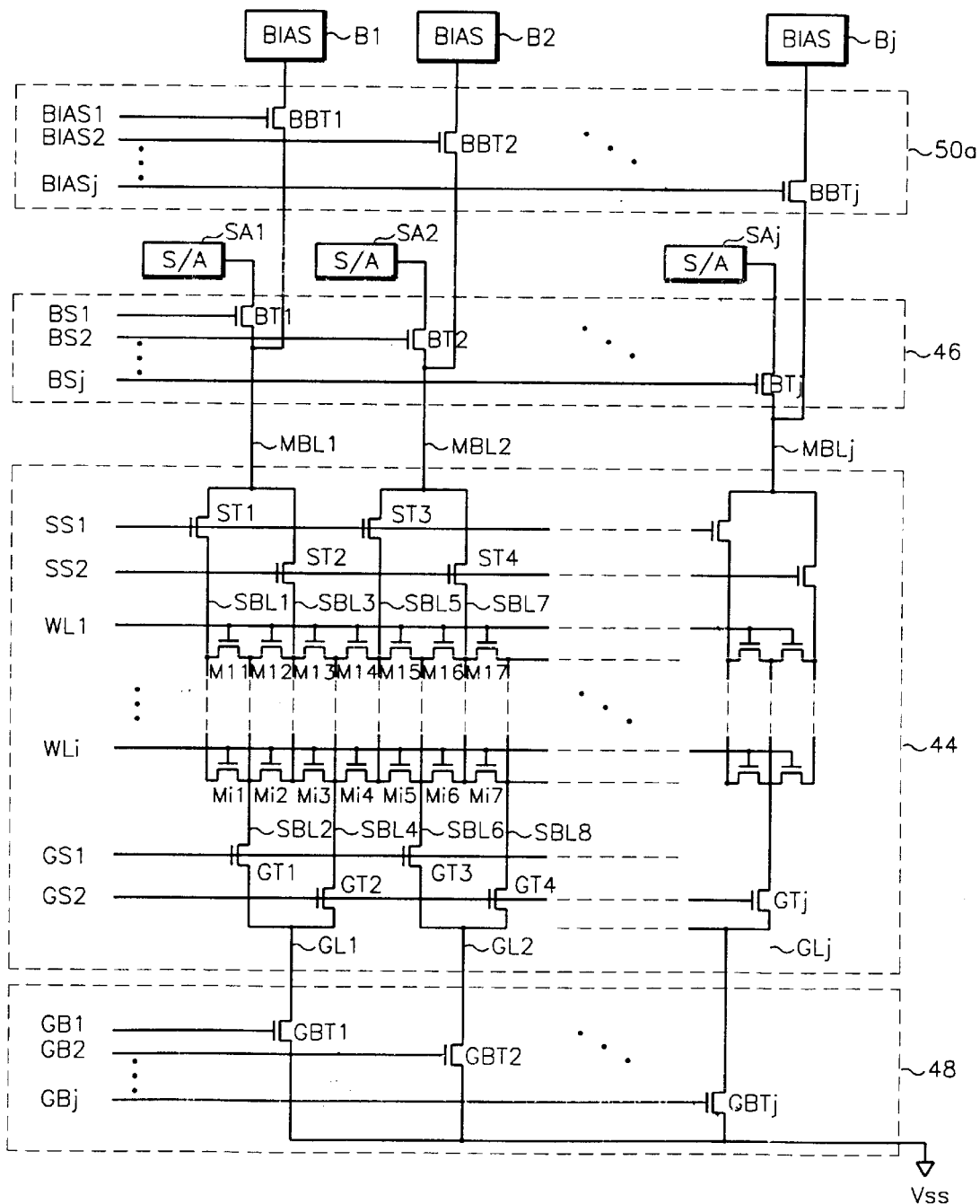
FIG. 7 is a circuit diagram of core part of a mask ROM according to a second embodiment of the present invention.

FIG. 7 shows the memory cell array block and its peripheral circuits of the NOR type mask ROM with hierarchical bit line architecture according to a second embodiment of the present invention.

Referring to FIG. 7, the NOR type ROM of this embodiment has the same construction as the NOR type ROM of the first embodiment shown in FIG. 3 except that bias voltage generation circuits B1~Bj are electrically connected to main bit lines MBL1~MBLj via a bias selection circuit 50a, respectively.

As described immediately above, assumption that the memory cells M11, M12, M13 and M14 shown in FIG. 7 are programmed as on-cells and the memory cell M15 as off-cell. When an address signal is externally applied to select the memory cell M15, the block selection signals BS2 and GB2 are activated and at the same time the string and bias selection signals SS2 and BIAS1 are activated. The bias voltage generation circuit B1 and the precharge circuits 52 and 54 allow the sub-bit line SBL3, the main bit line MBL2 and the reference line DDL2 to be precharged to the predetermined voltage level in response to the precharge con-trol signal PRE and sense amp control signal from the address transition detection circuit 30 (referring to FIG. 1). As a result, although the word line WL1 is activated to turn all the memory cells M11~M14 on, the sub-bit line SBL3 is previously precharged and thereby the loading of the bit lines related to the memory cell M15 is reduced.

In the above described embodiments of the present invention, the time required for precharging bit lines of a NOR type ROM is considerably shortened and no leakage current is generated, so that the ROM can be operated with a low power supply Vcc and at high speed.

What is claimed is:

1. A semiconductor read only memory having an hierarchical bit line architecture, comprising:

a plurality of first bit lines;

a plurality of memory cell groups each connected between two adjacent bit lines of the first bit lines;

a plurality of second bit lines, the first and second bit lines being in the ratio of 2:1;

a plurality of ground lines corresponding to the second bit lines, respectively;

a plurality of first switches each connected between an end of a corresponding odd-numbered bit line of the first bit lines and an end of a corresponding bit line of the second bit lines;

a plurality of second switches each connected between an end of a corresponding even-numbered bit line of the second bit lines and an end of a corresponding ground line of the ground lines; and means for charging at least one adjacent non-selected bit line of the first bit lines at both sides of at least one selected bit line of the first bit lines to a predetermined voltage level, when a precharging operation is carried out to sense data through at least one selected bit line of the second bit lines.

2. The semiconductor read only memory as defined in claim 1, wherein said predetermined voltage level is a precharged voltage level of each of the second bit lines.

3. The semiconductor read only memory as defined in claim 1, wherein said charging means comprises means for generating a bias voltage equal to a precharged voltage in response to a bit line precharge control signal, and a plurality of third switches each connected between the other end of the corresponding ground line and the bias generating means, and wherein at least one corresponding switch of the second switches and at least one corresponding switch of the third switches at both the sides of the at least selected bit line of the first bit lines during a bit line precharging time.

4. The semiconductor read only memory as defined in claim 1, wherein said charging means comprises means for generating a bias voltage equal to a precharged voltage in response to a bit line precharge control signal, and a plurality of third switches each connected between the other end of the corresponding ground line and the bias generating means, and wherein at least one corresponding switch of the first switches and at least one corresponding switch of the third switches at both the sides of the at least selected bit line of the first bit lines during a bit line precharging time.

5. A method for reading data stored in a semiconductor read only memory having an hierarchical bit line architecture, said semiconductor read only memory including a plurality of first bit lines, a plurality of memory cell groups each connected between two adjacent bit lines of the first bit lines, a plurality of second bit lines, the first and second bit lines being in the ratio of 2:1, a plurality of ground lines corresponding to the second bit lines, respectively, a plurality of first switches each connected between an end of a corresponding odd-numbered bit line of the first bit lines and an end of a corresponding bit line of the second bit lines, and a plurality of second switches each connected between an end of a corresponding even-numbered bit line of the second bit lines and an end of a corresponding ground line of the ground lines, the method comprising the steps of:

charging at least one adjacent non-selected bit line of the first bit lines at both sides of at least one selected bit line of the first bit lines to a predetermined voltage level, when at least one selected bit line of the second bit lines is precharged; and carrying out a data sensing operation through the at least one selected bit line of the second bit lines.

* * * * *